United States Patent [19]

Keith

[11] Patent Number: 4,927,515
[45] Date of Patent: May 22, 1990

[54] CIRCULAR MAGNETRON SPUTTERING DEVICE

[75] Inventor: Douglas L. Keith, Santa Clara, Calif.

[73] Assignee: The Board of Trustees of the Leland Stanford Junior University, Stanford, Calif.

[21] Appl. No.: 295,237

[22] Filed: Jan. 9, 1989

[51] Int. Cl.[5] .................... C23C 14/34; C23C 14/56
[52] U.S. Cl. ...................... 204/298.21; 204/298.09; 204/298.24; 204/298.35; 204/298.37
[58] Field of Search .................. 204/192.12, 192.24, 204/192.32, 298 CS, 298 CM, 298 SM, 298 EM, 298 EE; 156/345

[56] References Cited

U.S. PATENT DOCUMENTS

| | | |
|---|---|---|
| 3,728,246 | 4/1973 | Barkhudarov et al. ............. 264/298 |
| 3,884,793 | 5/1975 | Penfold et al. ...................... 204/298 |
| 3,939,052 | 2/1976 | Riley .............................. 204/192.14 |
| 4,249,925 | 2/1981 | Kawashima et al. ................ 65/3.12 |
| 4,434,042 | 2/1984 | Keith .................................. 204/298 |
| 4,530,750 | 6/1985 | Aisenberg et al. .................. 204/298 |
| 4,775,075 | 11/1973 | Keck et al. ........................... 65/3.12 |

*Primary Examiner*—Aaron Weisstuch
*Attorney, Agent, or Firm*—Henry K. Woodward; 10

[57] ABSTRACT

A circular magnetron sputtering device has a cathode structure including an annular magnet and an annular body of target material positioned coaxially with and inside of said annular magnet, and an anode structure spaced from and in juxtaposition with openings of said annular magnet. An elongated substrate is passed through the anode structure and through said cathode structure where sputtered target material is deposited on said elongated substrate.

5 Claims, 3 Drawing Sheets

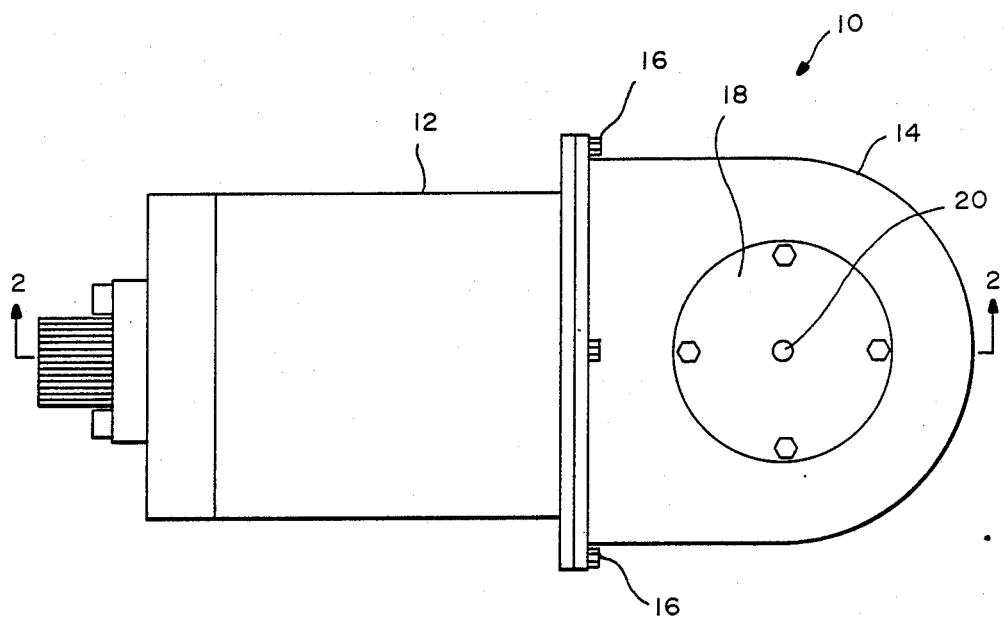
FIG.—1
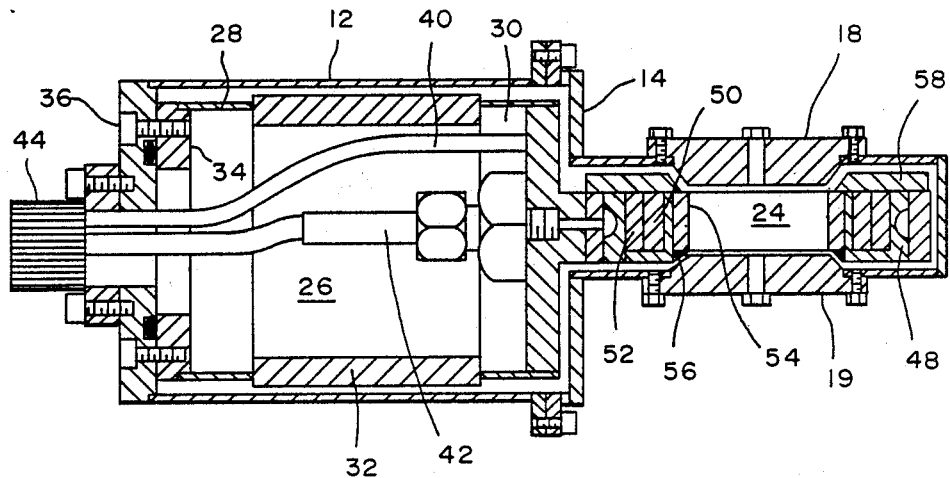
FIG.—2

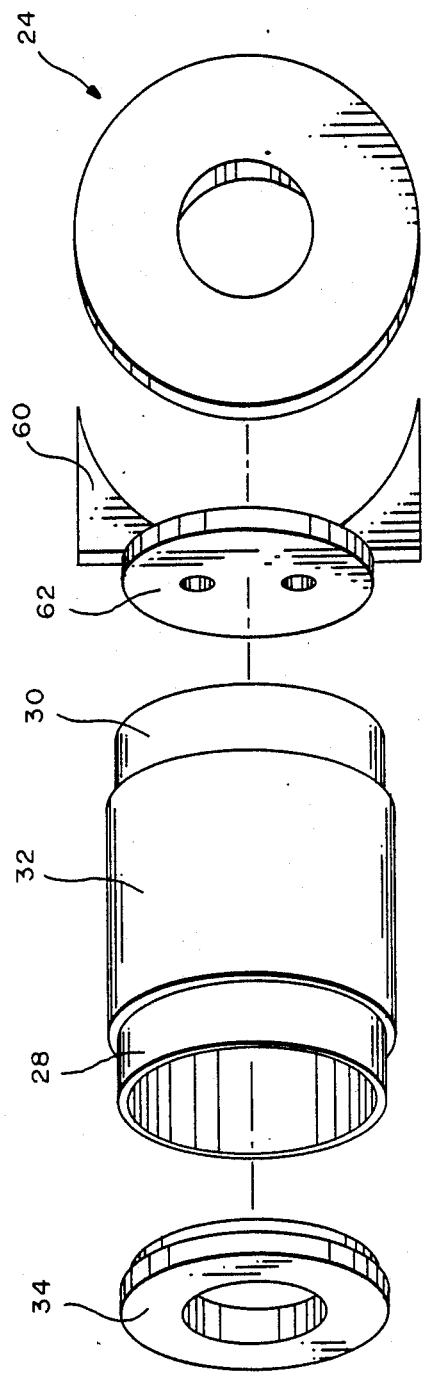
FIG.—3

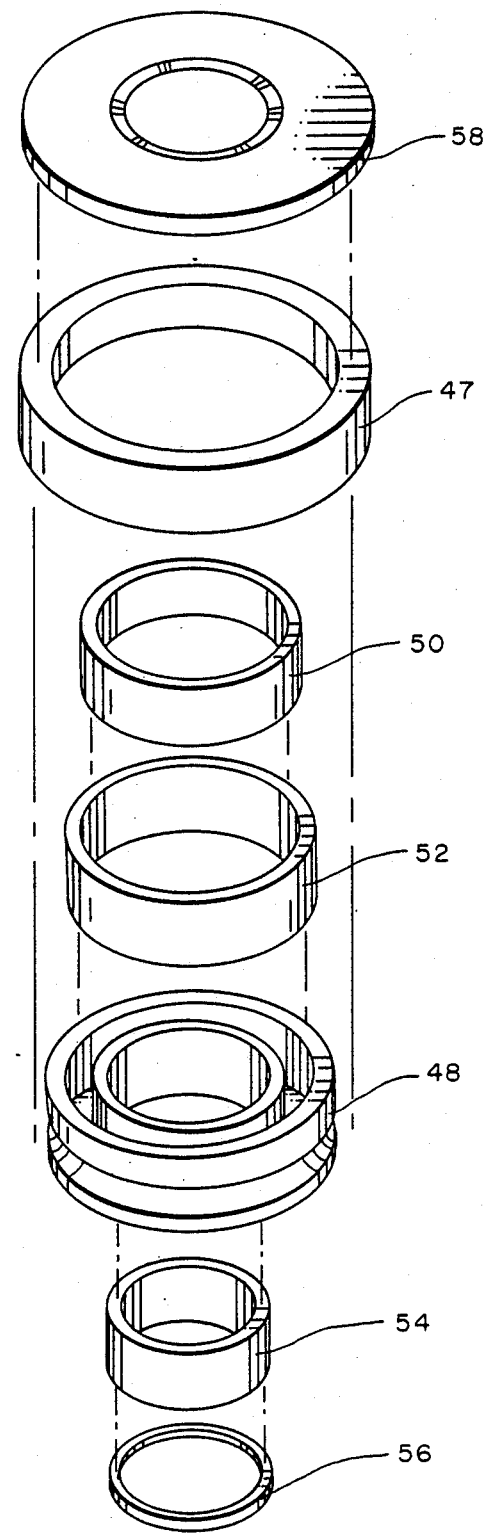
FIG.—4

CIRCULAR MAGNETRON SPUTTERING DEVICE

The U.S. Government has rights in the disclosed and claimed invention pursuant to National Science Foundation Agreement No. DMR-87-21735 with Stanford University.

BACKGROUND OF THE INVENTION

This invention relates generally to sputtering apparatus, and more particularly the invention relates to a circular magnetron sputtering apparatus.

Ion plasma sputtering and ion beam sputtering are the two predominant procedures for ion sputtering. In ion plasma sputtering a gas discharge plasma is produced directly at the sputtering surface, and the ions produced in the plasma bombard a target which is at a large negative potential. The most widely used method for deposition of films, owing to its simplicity, is the ion plasma sputtering method. However, conventional ion plasma sputtering techniques are hindered by low rates of sputtering, high working voltages, intense temperatures, and radiation defects in the deposited film.

Attempts at eliminating these limitations of the ion plasma sputtering have led to the creation of better sputtering systems with high deposition rates. The most important development has been the magnetron system for ion sputtering of material as discussed by Danillin and Sirchin in "Magnetron Systems for Ion Sputtering of Materials" Moscow Institute of Electronic Engineering, No. 4, pgs. 7–18, July-August, 1978 (translation copyrighted by Plenum Publishing Corporation 1979), and Chapin, "The Planar Magnetron: A New High Rate Sputtering Source," Vacuum Technology Associates Inc. As discussed by Danalin and Sirchin, the magnetron ion sputtering system is similar to the microwave magnetron device in using crossed magnetic and electric fields. However, the magnetron ion sputtering device is a diode type sputtering system in which the atom of the sputtered material is removed from the surface of a target as it is bombarded with ions of the working gas, usually argon, produced in an anomalous glow discharge plasma. The principal elements of the system are a target cathode, an anode, and a magnetic system. A characteristic feature of the system is the presence of a magnetic field at the sputtered surface of the target which makes it possible to localize the plasma of the anomalous glow discharge directly at the target. When a dc voltage is applied between the target (negtive potential) and the anode (positive or ground potential), an inhomogeneous electric field is produced and an anomalous glow discharge is developed. The electrons emitted from the cathode under the influence of the ion bombardment are captured by the magnetic field and remain as if in a trap produced by the magnetic field, which returns the electrons to the cathode, and by the target surface which repels the electrons. The electrons remain in this trap until several ionizing collisions take place with the atoms of the working gas as a result of which the electrons loose the energy acquired from the electric field. Before the electron falls on the cathode, the greater part of its energy is used for ionization and excitation of the gas thereby considerably increasing the activeness of the ionization process and leading to an increase in the concentration of the positive ions at the target surface. This in turn leads to an increase in the intensity of the ion bombardment of the target and to a considerable increase in the sputtering rate.

U.S. Pat. No. 4,434,042 discloses a planar magnetron sputtering apparatus which has proved commercially successful in producing planar sputtered films with an improved uniformity. However, a need exists for fabricating coated fibers and rods of semiconductors and superconductors. However, known magnetron sputtering apparatus are limited in use to fabricating planar thin films of superconducting material and other material. Conventional methods for coating thin films on rods, tubes or fibers consist of sputtering from a source designed to deposit on a planar or flat surface. In order to obtain uniform coatings all around the substrate, the substrate must be rotated or otherwise turned during the sputtering procedure. In coating by evaporation the same situation exists because the evaporated coatings are produced under high vacuum conditions, and the materials are deposited in a line-of-sight fashion.

SUMMARY OF THE INVENTION

An object of the present invention is a circular magnetron sputtering apparatus.

Another object of the invention is a method of forming coatings on fibers, rods, tubes, and the like using radial magnetron sputtering techniques.

Briefly, magnetron sputtering apparatus in accordance with the invention comprises a cathode structure including an annular magnet and an annular target material inside of and axially aligned with the magnet. An anodic shield is provided around the cathode structure and confines a gas plasma within the cathode. Means is provided for energizing the cathode with a negative potential while the anode is preferably grounded. Water cooling can be provided through the cathode structure to remove excess heat.

In one embodiment, the anode has openings through which a fiber or rod can be fed through the cathode structure for the sputter deposition of material on the fiber or rod. Since the fiber or rod is fed along the axis of the cathode, a uniform coating is deposited. Advantageously the apparatus can be used in fabricating superconducting coatings on rods and fibers in a continuous flow process.

The invention and other features thereof will be more readily apparent from the following detailed description and appended claims when taken with the drawings.

BRIEF DESCRIPTION OF THE DRAWINGS

FIG. 1 is a plan view of a circular magnetron sputtering device in accordance with the invention.

FIG. 2 is a section view of the circular magnetron sputtering device taken along the line 2—2 of FIG. 1.

FIG. 3 is an exploded perspective view illustrating the structure of the cathode and adapter support for the cathode.

FIG. 4 is an exploded perspective view of the cathode structure of the circular magnetron device of FIG. 1.

DETAILED DESCRIPTION OF ILLUSTRATED EMBODIMENT

Referring now to the drawings, FIG. 1 is a plan view of a circular magnetron sputtering device in accordance with the invention. The housing shown generally at 10 includes two portions 12 and 14 having abutting flanges adjoined by bolts 16. A top cover 18 and a bottom cover (not shown) are removably attached to the housing for access to a cathode structure therein. A hole 20 is provided in the cover 18 for inserting or feeding a fiber and the like through the cathode structure during a sputtering operation. During normal operation the housing 10 is grounded and the portion 14 functions as the anode of the magnetron sputtering device and confines a plasma within the cathode structure.

FIG. 2 is a section view of the apparatus of FIG. 1 taken along the line 2—2. A cathode structure shown generally at 24 is supported by an adaptor shown generally at 26 with the cathode 24 positioned within the housing portion 14 and the adaptor 26 positioned within the housing portion 12. The adaptor comprises two stainless steel rings 28 and 30 joined to a ceramic insulator 32. Ring 28 is welded to a steel support ring 34 which in turn is fastened to an end plate 36 of the housing 10. Electric power line 40 and water coolant lines 42 extend from a coupling 44 to the cathode structure 24.

Referring to FIGS. 3 and 4, the cathode structure comprises a composite annular steel ring 47 and support 48 which receives an annular rare-earth magnet 50 (cobalt samarium) with a ferromagnetic ring 52 provided around the magnet to provide a flux return path. The magnet is magnetized parallel to the inner and outer sides. An annular target material 54 is provided within the support 48 and the magnet 50 and rests on a rim 56 at one end of the support 48 with a clamp 58 holding the target material 54 within the cathode structure. The target material can be copper, silver, or a 1-2-3 compound superconducting material, for example. The cathode structure 24 is welded to an arcuate support 60 which is integral with a disc 62. Disc 26 is welded to ring 30.

In operation, the housing is filled with an ionizable gas such as argon and a voltage differential, dc or rf, of 200–900 volts is established between the anode and cathode. Preferably, the housing anode is grounded and a negative voltage is applied to the cathode through the electrical power line 40 shown in FIG. 2. The electric and magnetic fields establish a plasma within the target 54. The plasma is greatly concentrated by the entrapment of electrons in the electric and magnetic fields and causes removal of material from the target which is then uniformly deposited on a cylindrical substrate extending through the hollow cathode. As noted above, a continuous fiber can be fed through the cathode in a continuous deposition process. Further, a plurality of circular magnetron sputtering devices can be aligned so that a plurality of layers of deposited material can be formed on the substrate.

In addition to the regular deposition of material on a substrate, the electron beam emitted from the center of the plasma can be used for cleaning an incoming fiber, tube or rod. The electron beam emitted from the center of the plasma can be focused by magnetic or electrostatic lenses, the beam intensity being dependent on the voltage differential between the anode and cathode, the magnetic field of the magnet, and gas pressure.

There has been described a circular magnetron sputtering device useful in uniformly and radially coating a substrate positioned within the cathode structure or continuously fed through the cathode structure. As noted, these structures can be used for electron beam cleaning of a substrate material as well as the deposition of material on a substrate. While the invention has been described with reference to a specific embodiment, various modifications and applications may occur to those skilled in the art without departing from the true spirit and scope of the invention as defined by the appended claims.

I claim:

1. A circular magnetron sputtering device comprising
  a cathode structure including an annular magnet and an annular body of target material positioned coaxially with and inside of said annular magnet,
  adapter means including a central insulating body portion of cylindrical configuration and an electrically conductive end portion attached to said central insulating portion and to said cathode structure generally perpendicular to the axis of said annular magnet for supporting said cathode structure,
  an anode structure spaced from and in juxtaposition with openings of said annular magnet, said anode structure including a housing for receiving said adapter means,
  electrical power interconnect means connected to said electrically conductive end portion of said adapter means for energizing said cathode structure, and
  means for providing a coolant flow through said cathode structure.

2. The circular magnetron sputtering device as defined by claim 1 wherein said anode structure has openings through which an elongated body can be placed within said cathode structure for the sputter deposition of target material.

3. The circular magnetron sputtering device as defined by claim 1 wherein said means for providing a coolant includes a support structure for said annular magnet and said annular body of target material, said supporting structure having an annular groove therein for passing a coolant fluid, and means for passing a coolant fluid through said electrically conductive end portion and said annular groove.

4. A circular magnetron device for plasma cleansing of an object, comprising
  a cathode structure including an annular magnet,
  adapter means for physically supporting said cathode structure, said adapter means including a central insulating body portion of cylindrical configuration and an electrically conductive end portion attached to said central insulating portion and to said cathode structure generally perpendicular to the axis of said annular magnet for supporting said cathode structure,
  an anode structure spaced from an in juxtaposition with openings of said annular magnet, said anode structure including a housing for receiving said adapter means;
  electrical power interconnect means connected to said electrically conductive end portion for energizing said cathode structure, and
  means for providing a coolant flow through said cathode structure.

5. The circular magnetron device as defined by claim 4 and further including a support structure for said annular magnet, said support structure having an annular groove therein for passing a coolant fluid.

* * * * *